United States Patent [19]
Fujii

[11] Patent Number: 5,993,043
[45] Date of Patent: Nov. 30, 1999

[54] LITHOGRAPHY PROCESSING APPARATUS FOR MANUFACTURING SEMICONDUCTOR DEVICES

[75] Inventor: Kazunori Fujii, Tokyo, Japan

[73] Assignee: NEC Corporation, Tokyo, Japan

[21] Appl. No.: 08/978,582

[22] Filed: Nov. 26, 1997

[30] Foreign Application Priority Data

Nov. 29, 1996 [JP] Japan ...................................... 8-319468

[51] Int. Cl.⁶ ............................. G06F 19/00; H01L 21/30
[52] U.S. Cl. ................................ 364/468.28; 364/468.27
[58] Field of Search ........................ 364/468.28, 468.27, 364/490, 478.01, 468.26

[56] References Cited

U.S. PATENT DOCUMENTS

| | | | |
|---|---|---|---|
| 4,829,444 | 5/1989 | Saitou et al. ............................. | 364/468 |
| 4,835,704 | 5/1989 | Eichelberger et al. ................. | 364/490 |
| 5,657,235 | 8/1997 | Liebmann et al. ................. | 364/474.24 |
| 5,798,937 | 9/1995 | Bracha et al. .......................... | 364/490 |
| 5,825,647 | 3/1996 | Tsudaka ............................. | 364/167.03 |

FOREIGN PATENT DOCUMENTS

| | | |
|---|---|---|
| 63-80529 | 4/1988 | Japan . |
| 6439726 | 2/1989 | Japan . |
| 1120819 | 5/1989 | Japan . |

*Primary Examiner*—William Grant
*Assistant Examiner*—Ivan Calcaño
*Attorney, Agent, or Firm*—Sughrue, Mion, Zinn, Macpeak & Seas, PLLC

[57] ABSTRACT

A semiconductor device manufacturing apparatus includes a processing device, a measuring device, and a data server. The processing device performs a lithography process and outputs process record data containing product information about a semiconductor device and process information. The measuring device measures a record offset from a target value in the semiconductor device processed by the processing device, and outputs measurement record data. The data server stores the process record data from the processing device and the measurement record data from the measuring device, calculates a correction value on the basis of a past record offset in response to a request from the processing device, and sends it back to the processing device. The data server has a data storage unit for storing the process record data and the measurement record data, a data arrangement unit for arranging the data stored in the data storage unit in accordance with stratification conditions, and determining target data from the data arranged by stratum on the basis of new process record data from the processing device, and a correction value calculation unit for performing calculation for the target data to obtain a correction value.

6 Claims, 3 Drawing Sheets

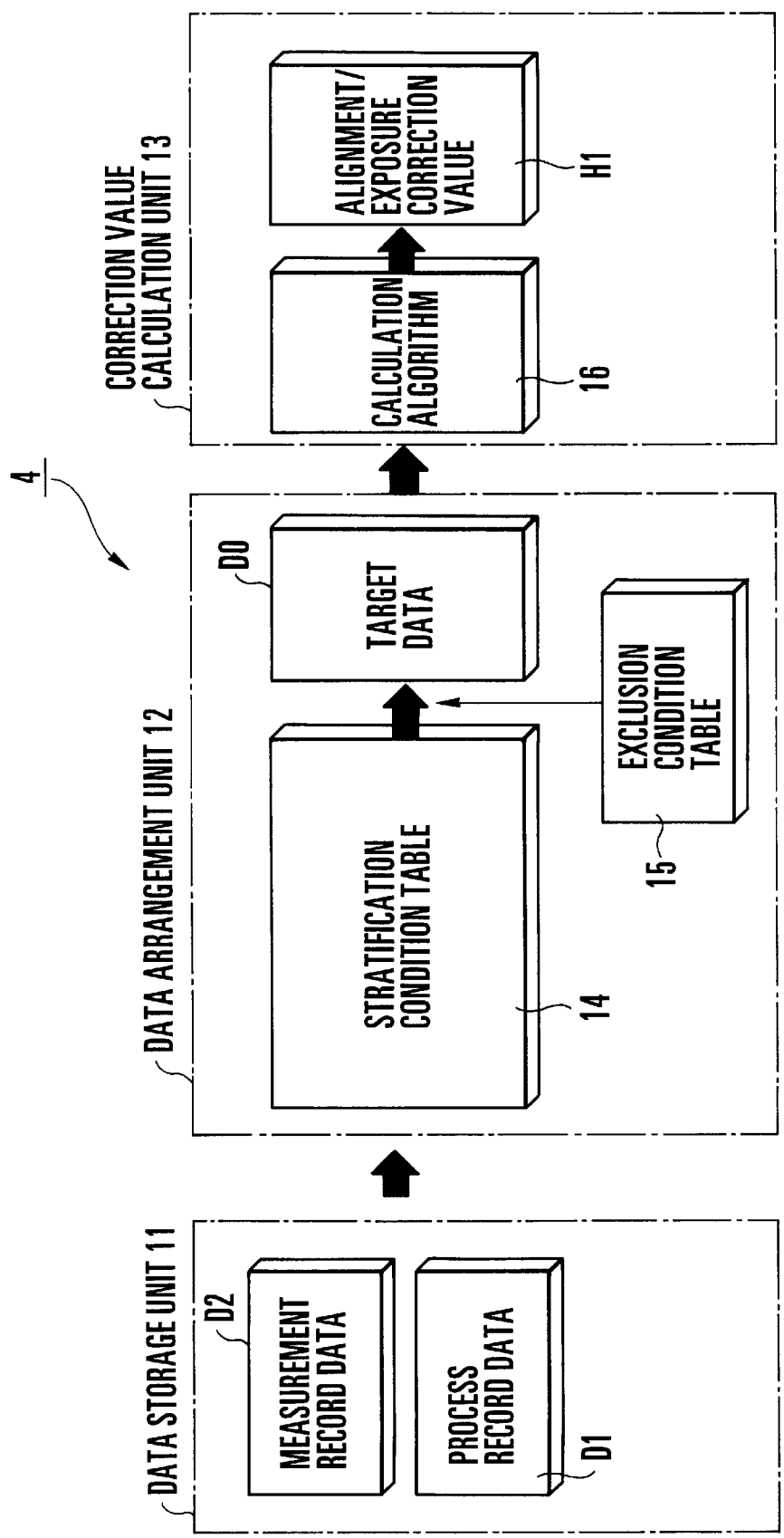
F I G. 2

LITHOGRAPHY PROCESSING APPARATUS FOR MANUFACTURING SEMICONDUCTOR DEVICES

BACKGROUND OF THE INVENTION

The present invention relates to a semiconductor device manufacturing apparatus and, more particularly, to a manufacturing apparatus suited for use in a photolithography step for forming a plurality of pattern layers on a semiconductor substrate.

In manufacturing a semiconductor device, the step of stacking an upper pattern layer on a lower pattern layer formed on a semiconductor substrate is required. In this step, a photolithography step utilizing photography is used. In the photolithography step, when the upper pattern layer is to be exposed, so-called alignment of accurately aligning the upper pattern layer with the lower pattern layer must be managed at high accuracy. To realize a high alignment accuracy, a technique of measuring and storing a latent alignment accuracy offset of an exposure device itself in advance, and performing correction on the basis of the stored accuracy offset in actual exposure has conventionally been proposed. This technique is disclosed in, e.g., Japanese Patent Laid-Open Nos. 64-39726 and 63-80529. In addition, a technique of exposing a wafer called a pilot wafer or test wafer, and feeding back and correcting a positional accuracy obtained from the result in actual exposure has been proposed. This technique is disclosed in, e.g., Japanese Patent Laid-Open No. 1-120819.

The conventional technique described above is effective for an offset generated uniquely to some extent such as the latent offset of the exposure device. Today, however, the product design rule becomes stricter, and an offset between subsidiary materials which should produce the same result cannot be ignored. Accordingly, the influence of an offset generated in the process also becomes serious, and the alignment cannot be managed at high accuracy by the correction function of only the exposure device. The technique using a test wafer is advantageous in correcting an offset in the exposure device or the process. However, another wafer cannot be processed during processing of the test wafer, measurement, and feedback of data, resulting in low processing ability of the exposure device.

SUMMARY OF THE INVENTION

It is an object of the present invention to provide a semiconductor device manufacturing apparatus capable of correcting offsets containing not only an offset of an exposure device but also an offset generated in the process to realize high alignment accuracy.

It is another object of the present invention to provide a semiconductor device manufacturing apparatus which allows the manufacture with very high processing ability.

In order to achieve the above objects, according to the present invention, there is provided a semiconductor device manufacturing apparatus comprising a processing device for performing a lithography process and outputting process record data containing product information about a semiconductor device and process information, a measuring device for measuring a record offset from a target value in the semiconductor device processed by the processing device, and outputting measurement record data, and a data server for storing the process record data from the processing device and the measurement record data from the measuring device, calculating a correction value on the basis of a past record offset in response to a request from the processing device, and sending back the correction value to the processing device, the data server having data storage means for storing the process record data from the processing device and the measurement record data from the measuring device, data arrangement means for arranging the data stored in the data storage means in accordance with stratification conditions, and determining target data from the data arranged in units of strata on the basis of new process record data from processing device, and correction value calculation means for performing calculation for the target data output from the data arrangement means by using a predetermined algorithm to obtain a correction value to be sent back to the data server.

BRIEF DESCRIPTION OF THE DRAWINGS

FIG. 2 is a block diagram of the arrangement of a data server shown in FIG. 1.

DESCRIPTION OF THE PREFERRED EMBODIMENTS

The present invention will be described below with reference to the accompanying drawings.

Figure 1:
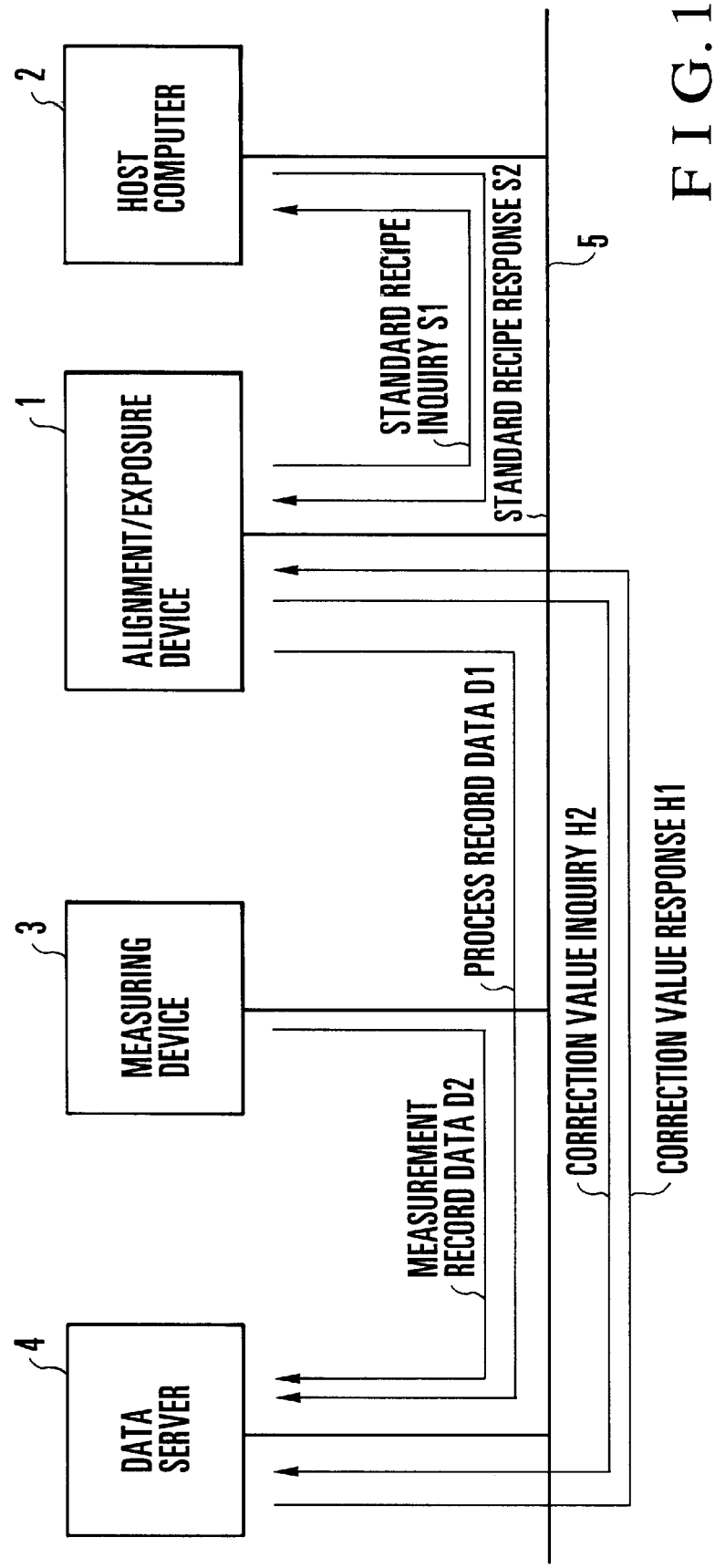
FIG. 1 is a block diagram of the arrangement of a semiconductor device manufacturing apparatus according to the first embodiment of the present invention.

FIG. 1 shows the whole arrangement of a semiconductor device manufacturing apparatus according to the first embodiment of the present invention. In FIG. 1, an alignment/exposure device 1 for performing a photolithography step for a semiconductor device (semiconductor wafer) is connected to a host computer 2, a measuring device 3, and a data server 4 via a bus 5. The alignment/exposure device 1 sends, to the data server 4, process record data D1 made up of product information such as the product name, type, and the like of an actually processed semiconductor device, an actually used process parameter, and process information such as a correction value used at that time, reticle information used for exposure, and a working machine number. The measuring device 3 measures an alignment offset from a target value in an actually manufactured semiconductor device, and sends it as measurement record data D2 to the data server 4. The data server 4 stores the process record data D1 from the alignment/exposure device 1 and the measurement record data D2 from the measuring device 3 in the history order of processes.

The alignment offset (shift amount) indicated by the measurement record data D2 includes a shift X, a shift Y, a scale X, a scale Y, wafer rotation, orthogonality, reticle rotation, and magnification. The host computer (to be referred to as a host hereinafter) 2 stores in advance all standard recipes of various semiconductor devices which are performed by the alignment/exposure device 1. When the host 2 receives a standard recipe request S1 for a specific semiconductor device from the alignment/exposure device 1, the host 2 sends a standard recipe S2 of the target semiconductor device to the alignment/exposure device 1.

FIG. 2 shows the arrangement of the data server 4 in FIG. 1. In FIG. 2, the data server 4 is constituted by a data storage unit 11, a data arrangement unit 12, and a correction value calculation unit 13. The data storage unit 11 stores the process record data D1 and the measurement record data D2 in the input order. When a predetermined period has elapsed, or the capacity overflows, the process record data D1 and the measurement record data D2 are erased in the order from older data.

The data arrangement unit 12 comprises a stratification condition table 14 having stratification conditions for stratifying the process record data D1 and the measurement record data D2 stored in the data storage unit 11 on the basis of product information such as the type, step, and the like of semiconductor device, a used reticle, an exposure working machine number, a measurement working machine number, and the like, and an exclusion condition table 15 having exclusion conditions for excluding improper data from the temporarily stratified data. Using the stratification condition table 14 and the exclusion condition table 15, the data arrangement unit 12 narrows down data about the target semiconductor device to determine target data D0 in response to the input process record data D1. The correction value calculation unit 13 calculates a correction value from the target data D0 output from the data arrangement unit 12 by using a predetermined calculation algorithm 16, and outputs the calculated value as an alignment/exposure correction value H1.

The operation of the manufacturing apparatus having the above arrangement will be described below.

The alignment/exposure device 1 sends, to the host 2, product information such as the product name, type, and the like of a semiconductor device to be processed, and performs an inquiry S1 of the standard recipe. In response to the inquiry S1, the host 2 outputs a standard recipe S2 corresponding to the target semiconductor device to the alignment/exposure device 1. The alignment/exposure device 1 sets the standard recipe S2 from the host 2 therein. Before and after this, the alignment/exposure device 1 sends, to the data server 4, the product information about the semiconductor device, and in addition process information in an actual process, i.e., a used reticle, an exposure working machine number, and the like, and performs an inquiry H2 of their correction values.

Upon reception of the correction value inquiry H2 from the alignment/exposure device 1, the data server 4 stores the product information about the semiconductor device and the process information which have been input, as process record data D1 in the data storage unit 11. With reference to the stratification condition table 14, the data arrangement unit 12 narrows down the stored process record data D1 and measurement record data D2 to data corresponding to the product information about the semiconductor device and the process information which have been input. Further, with reference to the exclusion condition table 15, the data arrangement unit 12 excludes unnecessary data not corresponding to the input information, e.g., data outside the acceptable range, thereby determining target data D0. Using the applied calculation algorithm 16, the correction value calculation unit 13 calculates an alignment/exposure correction value H1 in the target semiconductor device from the target data D0, e.g., past measurement record data. The alignment/exposure correction value H1 is sent back to the alignment/exposure device 1 as a correction value response.

Upon reception of the correction value response H1 from the data server 4, the alignment/exposure device 1 corrects the standard recipe S2 set therein, and executes alignment/exposure based on the corrected standard recipe. A semiconductor device manufactured by this alignment/exposure is measured by the measuring device 3, and the measurement result is sent as measurement record data D2 to the data server 4. The data server 4 stores the measurement record data D2 from the measuring device 3 in the data storage unit 11 in the chronological order of processes.

By repeatedly performing this operation, the process record data D1 corresponding to the product information about the semiconductor device and the process information, and the measurement record data D2 are sequentially stored in the data storage unit 11 of the data server 4. In accordance with this storage, the target data D0 narrowed down with reference to the stratification condition table 14 of the data arrangement unit 12 is also sequentially updated to data of an immediately preceding process. The correction value H1 can always be obtained on the basis of the latest target data.

In this manner, high-accuracy alignment/exposure and a photolithography step associated with this are realized without using a test wafer. In this case, the accuracy is very high because not only a unique offset generated in the alignment/exposure device but also an offset caused by the influence of a reticle or another subsidiary material used in this step can be eliminated. Since no test wafer is used, a decrease in processing ability due to the standby time can be prevented.

Figure 3:
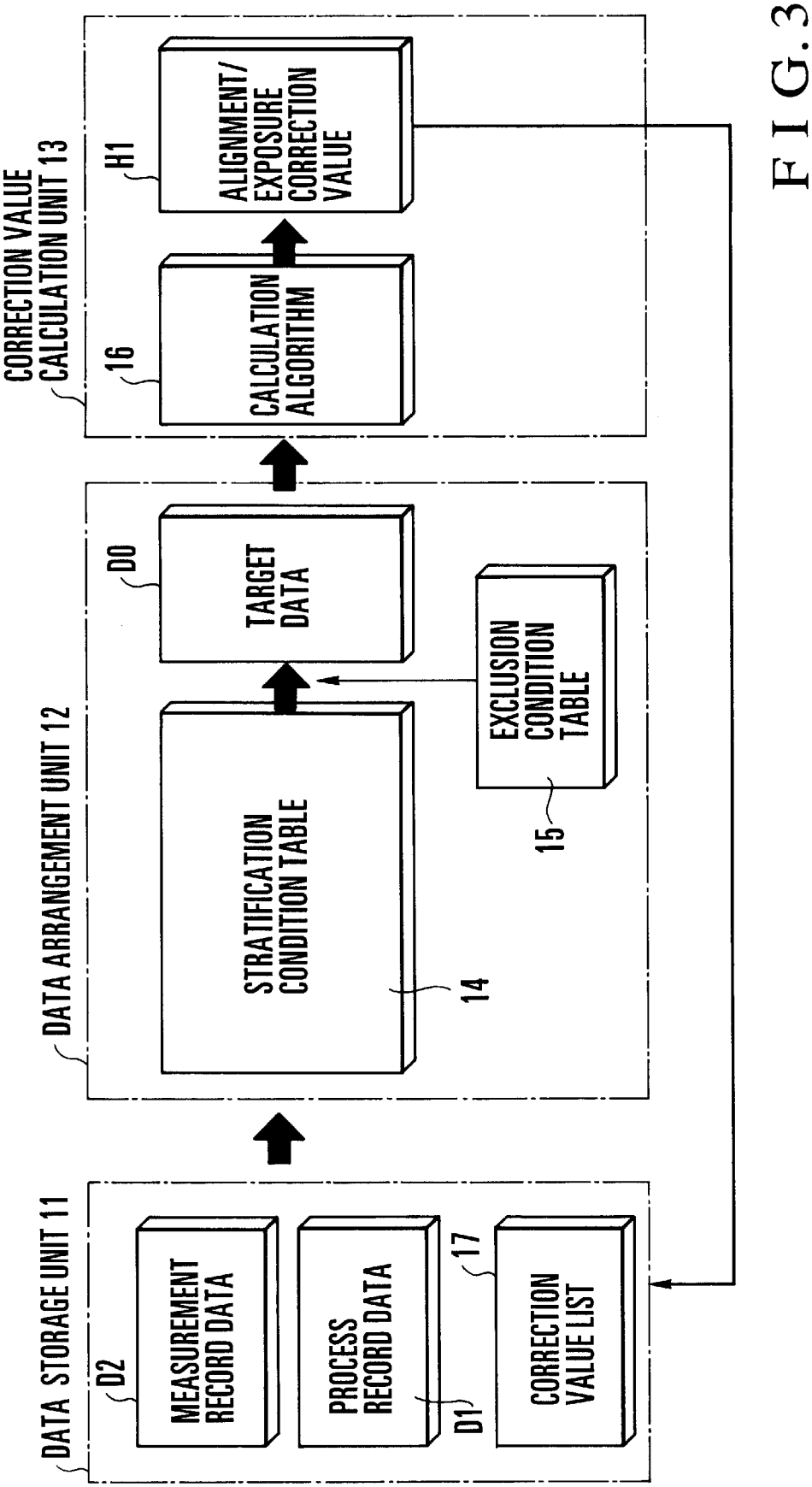
FIG. 3 is a block diagram of the arrangement of a data server according to the second embodiment of the present invention.

FIG. 3 shows the arrangement of a data server according to the second embodiment of the present invention. The same reference numerals as in FIG. 2 denote the same parts in FIG. 3. In the second embodiment, a data storage unit 11 further comprises a correction value list 17 for storing an alignment/exposure correction value H1 calculated in a correction value calculation unit 13. That is, when the alignment/exposure correction value H1 is calculated on the basis of product information about a semiconductor device and process information which have been input, the alignment/exposure correction value H1 is stored in the correction value list 17 of the data storage unit 11. When the same product information and process information are input, the stored correction value H1 is output without calculating a correction value again.

When, for example, identical semiconductor devices are repeatedly or intermittently processed under the same conditions, a data server 4 can read the past correction value H1 obtained based on the same information from the correction value list 17 and immediately output the value H1 to the alignment/exposure device 1 in response to a correction value inquiry H2 from an alignment/exposure device 1. Therefore, the response time of the correction value H1 with respect to the correction value inquiry H2 from the alignment/exposure device 1 can be shortened to further enhance the processing ability.

The above-described embodiments have exemplified the case wherein the present invention is applied to a device for performing alignment/exposure in the photolithography step. However, the device is not limited to this, and the present invention can be similarly applied to another device as far as the device performs a process using photolithography.

Every time the process record data D1 is input, data stored in the data storage unit 11 is narrowed down on the basis of the stratification condition table 14. However, data arranged for stratification conditions may be stored in the stratification condition table 14 or another memory in advance.

As has been described above, according to the present invention, when a processing device sends product information and process information to a data server to request a correction value, the data server sets target data from the input information and corresponding measurement record data, calculates a correction value by a predetermined algorithm on the basis of the target data, and outputs the correction value. The processing device corrects the settings on the basis of the correction value, thereby realizing a high-accuracy process without using a test wafer. Accordingly, a high-accuracy process in which not only an offset uniquely generated by the processing device but also an offset generated depending on process conditions are eliminated can be realized. At the same time, the standby time required for the test wafer can be eliminated to increase the processing efficiency.

What is claimed is:

1. A semiconductor device manufacturing apparatus comprising:
   a processing device for performing a lithography process and outputting process record data containing product information about a semiconductor device and process information;
   a measuring device for measuring a record offset from a target value in said semiconductor device processed by said processing device, and outputting measurement record data; and
   a data server for storing the process record data from said processing device and the measurement record data from said measuring device, calculating a correction value on the basis of a past record offset in response to a request from said processing device, and sending back the correction value to said processing device, said data server having
   data storage means for storing the process record data from said processing device and the measurement record data from said measuring device,
   data arrangement means for arranging the data stored in said data storage means in accordance with stratification conditions, and determining target data from the data arranged by stratum on the basis of new process record data from said processing device, and
   correction value calculation means for performing calculation for the target data output from said data arrangement means by using a predetermined algorithm to obtain a correction value to be sent back to said data server.

2. An apparatus according to claim 1, further comprising a host computer for sending back a standard recipe of the lithography process in said processing device in response to a request from said processing device, and
   wherein said processing device corrects the standard recipe from said host computer on the basis of the correction value from said data server, and performs the lithography process in accordance with the corrected standard recipe.

3. An apparatus according to claim 1, wherein said data arrangement means comprises:
   a stratification condition table having stratification conditions for arranging process record data and measurement record data sequentially input from said processing device and said measuring device in units of strata; and
   an exclusion condition table having exclusion conditions for excluding unnecessary data when the target data is determined from the process record data and the measurement record data arranged with reference to the stratification condition table.

4. An apparatus according to claim 3, wherein said data arrangement means refers to the stratification condition table to arrange all process record data and measurement record data sequentially stored in said data storage means in units of strata.

5. An apparatus according to claim 1, wherein said data server further comprises correction value storage means for storing the correction value calculated by said correction value calculation means, and
   said data server reads and outputs a correction value corresponding to past information from said correction value storage means when the same past information as the process record information from said processing device is stored in said data storage means.

6. An apparatus according to claim 1, wherein said processing device is a device for performing alignment/exposure in the photolithography process in forming a multilayered pattern on a semiconductor device.

* * * * *